(12) United States Patent
Ji et al.

(10) Patent No.: US 9,705,307 B2
(45) Date of Patent: Jul. 11, 2017

(54) SELF-SENSING REVERSE CURRENT PROTECTION SWITCH

(71) Applicant: QUALCOMM Incorporated, San Diego, CA (US)

(72) Inventors: Honghao Ji, San Diego, CA (US); Dongwon Seo, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 225 days.

(21) Appl. No.: 14/606,746

(22) Filed: Jan. 27, 2015

(65) Prior Publication Data

US 2016/0218499 A1   Jul. 28, 2016

(51) Int. Cl.
*H02H 3/18*       (2006.01)
*H01L 27/02*      (2006.01)
*H02H 11/00*      (2006.01)

(52) U.S. Cl.
CPC ........... *H02H 3/18* (2013.01); *H01L 27/0266* (2013.01); *H01L 27/0292* (2013.01); *H02H 11/003* (2013.01)

(58) Field of Classification Search
CPC .... H02H 3/18; H01L 27/0266; H01L 27/0292
See application file for complete search history.

(56) References Cited

U.S. PATENT DOCUMENTS

| 5,862,301 | A  | * | 1/1999  | Gontowski, Jr. ........ H02P 1/26 318/632 |
| 5,963,055 | A  |   | 10/1999 | Tanaka et al. |
| 6,326,832 | B1 |   | 12/2001 | Macaluso |
| 6,400,209 | B1 |   | 6/2002  | Matsuyama et al. |
| 7,705,657 | B2 | * | 4/2010  | Ueda ................... H02H 11/003 327/309 |
| 2002/0026607 | A1 | * | 2/2002 | Takahashi ............ G11C 16/349 714/718 |
| 2003/0222703 | A1 |   | 12/2003 | Ker et al. |
| 2004/0052022 | A1 |   | 3/2004  | Laraia |
| 2004/0100745 | A1 | * | 5/2004 | Chen ................... H01L 27/0262 361/56 |
| 2007/0139836 | A1 |   | 6/2007  | Ueda |
| 2009/0261898 | A1 | * | 10/2009 | Sachdev ............. H03K 17/165 327/592 |

(Continued)

FOREIGN PATENT DOCUMENTS

EP          0351157       *   1/1990

OTHER PUBLICATIONS

International Search Report and Written Opinion—PCT/US2016/012072—ISA/EPO—May 4, 2016.

(Continued)

*Primary Examiner* — Thienvu Tran
*Assistant Examiner* — Tien Mai
(74) *Attorney, Agent, or Firm* — Haynes and Boone, LLP (36340)

(57) ABSTRACT

A reverse current protection (RCP) circuit is provided that includes an RCP switch coupled between a power supply rail and a buffer power supply node. A control circuit powered by a buffer supply voltage on the buffer power supply node controls the RCP switch to open in response to a discharge of a power supply voltage carried on the power supply rail.

19 Claims, 3 Drawing Sheets

(56) References Cited

U.S. PATENT DOCUMENTS

2012/0002334 A1 1/2012 Kosonocky et al.
2013/0063844 A1 3/2013 Sun

OTHER PUBLICATIONS

Mihhailov J., et al., "General Purpose Input/Output's Buffer with Reverse Current Protection Capability in Above Supply Level Condition," IEEE 12th Biennial Baltic Electronics Conference (BEC), Oct 2010, pp. 111-114.

* cited by examiner

SELF-SENSING REVERSE CURRENT PROTECTION SWITCH

TECHNICAL FIELD

This application relates to reverse current protection for an integrated circuit, and more particularly to a self-sensing reverse current switch.

BACKGROUND

It is conventional for modern electronic devices such as smartphones to include a plurality of interconnected integrated circuits. For example, a smartphone may include an application processor that interfaces with other integrated circuits such as sensors and baseband circuits. To save power, it is also conventional for these various integrated circuits to be independently operated such that one integrated circuit may be powered down in a deep sleep mode of operation while another integrated circuit continues to operate in a normal mode of operation. Although this independent operation of integrated circuits saves power, it raises the issue of reverse current generation.

To better appreciate the reverse current problem, note that the power supply rail for an integrated circuit's input/output (I/O) buffers will typically be protected by an electrostatic discharge (ESD) diode that couples from a buffer's I/O pad or terminal to the internal buffer power supply rail. Should an electrostatic discharge present a sudden application of positive voltage on the I/O terminal, the ESD diode becomes forward biased and safely discharges the electrostatic charge to the power supply rail. But suppose that the corresponding integrated circuit that includes the I/O terminal is powered down while another integrated circuit that interconnects to the I/O terminal is still operating. This additional integrated circuit may have a default mode in which it maintains the lead coupling to the I/O terminal at a positive voltage. The ESD diode will then be forward biased such that the power supply rail coupled to the I/O terminal will be charged to the positive voltage on the lead (minus a threshold voltage drop for the forward-biased ESD diode). The PMOS transistors in the integrated circuit having their sources coupled to the buffer power supply rail would then be conducting since their gates would be discharged due to the off state of the integrated circuit. Not only does this waste power but it also leads to erroneous operation or faults upon a subsequent powering up of the integrated circuit.

To address the reverse current problem, various approaches have been developed. For example, an integrated circuit such as an applications processor may be programmed to be aware of the state of other integrated circuits in the system. Should another integrated circuit be powered down, the processor would then discharge any leads it has that couple to I/O terminals on the powered-down integrated circuit. But such an approach burdens the user with having to program the processor accordingly. In another approach, external components may also be located in the signal path between integrated circuits to gate signals when an interconnected integrated circuit is powered down. Such external components increase manufacturing costs. Alternatively, an integrated circuit may be configured with a head switch that is switched off when the integrated circuit is powered down. This typically requires additional terminals and control signals, which raises manufacturing costs and complicates the design.

Accordingly, there is a need in the art for improved reverse current protection circuits.

SUMMARY

A reverse current protection (RCP) circuit for a first integrated circuit is provided that includes an RCP switch coupled between a power supply rail and an input/output (I/O) buffer power supply node. The buffer power supply node couples through an ESD diode to an I/O terminal that is driven by a remote integrated circuit. The remote integrated circuit may continue to drive the I/O terminal with a voltage signal while the first integrated circuit is in a deep sleep mode in which a power supply voltage carried on the power supply rail is discharged or collapsed. The ESD diode then becomes forward-biased so as to charge the buffer power supply node. The RCP circuit is configured to open the RCP switch in response to the discharge of the power supply voltage to eliminate any reverse-current-caused problems resulting from the charging of the buffer power supply node. During normal operation in which the power supply rail is powered, the RCP circuit closes the RCP switch to couple the power supply rail to the I/O buffer power supply node.

To detect the discharge of the power supply voltage, the RCP circuit includes a reference voltage circuit having a capacitor charged by the power supply voltage to generate a reference voltage. The capacitive storage in the reference voltage circuit causes the reference voltage to become greater than the power supply voltage when the power supply voltage is collapsed in the deep sleep mode. A control circuit in the RCP circuit responds to the reference voltage becoming greater than the power supply voltage by switching off (opening) the RCP switch. The control circuit switches on (closes) the RCP switch during a normal mode of operation in which the power supply voltage is greater than the reference voltage. The control circuit is coupled to the buffer power supply node for receiving power so that it may remain powered in the deep sleep mode and maintain the RCP switch in the off state.

The resulting RCP circuit is compact and low power. Moreover, it requires no additional terminals with regard to receiving control signals nor does it require any retooling or reprogramming of the remote integrated circuit. These and additional advantageous features may be better appreciated with regard to the following detailed description of example embodiments.

BRIEF DESCRIPTION OF THE FIGURES

Embodiments of the present disclosure and their advantages are best understood by referring to the detailed description that follows. It should be appreciated that like reference numerals are used to identify like elements illustrated in one or more of the figures.

DETAILED DESCRIPTION

A reverse current protection (RCP) circuit is provided having an RCP switch that acts as an ideal diode. The RCP switch is located on the power rail for one or more input/output buffers on a protected integrated circuit. Since the RCP switch acts as an ideal diode, it is switched on (closed) when the power rail is powered during normal operation of the protected integrated circuit. Should the power rail be powered down during a deep sleep mode, the reverse current switch switches off (opens) so that the protected I/O buffers may receive a live voltage signal from a remote integrated circuit that remains powered on while the protected integrated circuit is powered down. In this fashion, the electrostatic discharge diodes in the I/O buffers may become forward biased due to their terminals receiving a positive voltage signal from the powered-on integrated circuit yet the internal supply rail for the protected integrated circuit remains discharged because of the isolation through the RCP switch. The remote integrated circuit(s) may thus be entirely agnostic as to the power state for the protected integrated circuit. There is thus no need for any reprogramming of the remote integrated circuits. In contrast to the conventional back-power protection circuits discussed earlier, no control signals, additional pins, or external head switches are necessary. Some example embodiments will now be discussed.

Figure 1:
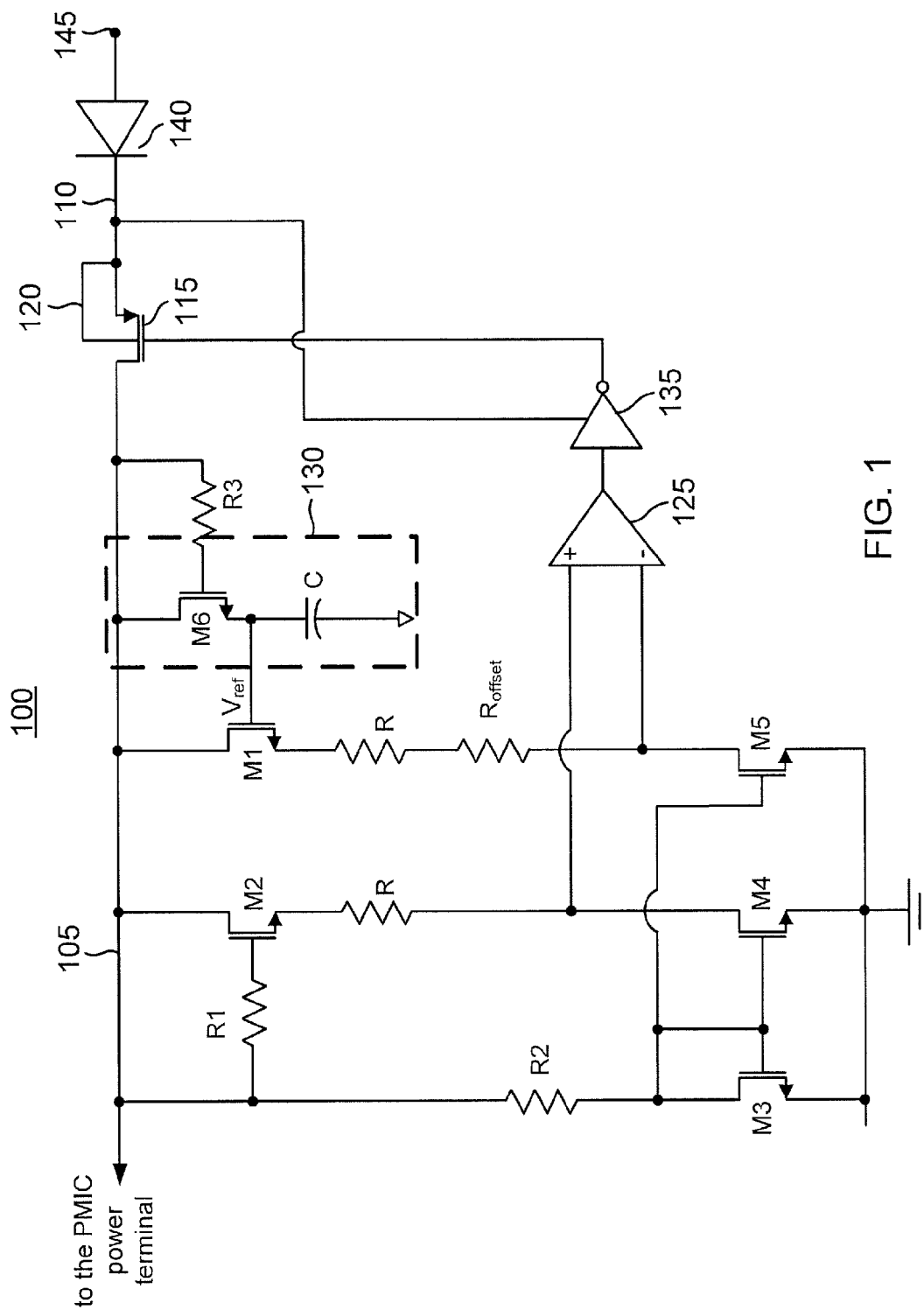
FIG. 1 is a circuit diagram of a reverse current protection circuit in accordance with an embodiment of the disclosure.

An example reverse current protection (RCP) circuit 100 is shown in FIG. 1. In this embodiment, RCP circuit 100 includes a PMOS RCP switch transistor 115 coupled between an input/output buffer power supply node 110 and a power supply rail 105. Internal power supply rail 105 couples to a power terminal (not illustrated) for receiving a power supply voltage from an external source such as a power management integrated circuit (PMIC). Buffer power supply node 110 couples through an ESD diode 140 to an input/output (I/O) terminal 145 such as a pad or a pin. As discussed previously, ESD diode 140 may become forward biased as the internal power supply voltage discharges towards ground while I/O terminal 145 remains charged by an external integrated circuit. Despite this forward biasing of ESD diode 140, RCP switch transistor 115 acts as an ideal diode and prevents the charging of I/O terminal 145 from charging power supply rail 105. To control this advantageous ideal diode behavior, RCP switch transistor 115 has its gate voltage controlled by an inverter 135 whose power is not obtained from power supply rail 105 but instead from the voltage carried on buffer power supply node 110. In this fashion, inverter 135 can still be powered so as to charge the gate of RCP switch transistor 115 even when power supply rail 105 is discharged. During regular operation while power supply rail 105 is charged, inverter 135 grounds the gate of RCP switch transistor 115 so that it is conducting. It is advantageous for RCP switch transistor 115 to be a PMOS transistor so that the power supply voltage carried on power supply rail 105 can couple to buffer power supply node 110 with minimal loss (in general, PMOS transistors pass a strong binary one). However, it will be appreciated that an NMOS transistor may be used to form RCP switch transistor 115 in alternative embodiments. The following discussion will thus assume that RCP switch transistor 115 is a PMOS transistor without loss of generality. An n-well 120 of RCP switch transistor 115 is tied to buffer power supply node 110 to keep the p-n junction between the source of RCP switch transistor 115 and its n-well 120 from being forward-biased when power supply rail 105 is discharged and an external integrated circuit powers terminal 145.

A comparator 125 in RCP circuit 100 functions to detect when power supply rail 105 is discharged such as would occur in a powered-down mode of operation for the integrated circuit including RCP circuit 100 (the protected integrated circuit). To enable this detection, a reference voltage circuit 130 coupled to power supply rail 105 generates a reference voltage (Vref). Reference voltage circuit 130 includes a diode-connected NMOS transistor M6 having its drain and gate coupled to power supply rail 105. To provide ESD protection, the gate of transistor M6 may couple to power supply rail 105 through an ESD resistor R3. During normal operation of the protected integrated circuit, internal power supply rail 105 is charged to a power supply voltage VDD. The diode-connected transistor M6 then functions as a diode such that its source will be charged to VDD–Vt, where Vt is the threshold voltage for diode-connected transistor M6. Reference voltage circuit 130 also includes a capacitor C that couples between the source of diode-connected transistor M6 and ground so that it is charged to the VDD–Vt voltage during normal operation. The source of diode-connected transistor M6 drives the gate of a source-follower NMOS transistor M1. Source-follower transistor M1 has its drain coupled to power supply rail 105. A resistor R couples between the source of source-follower transistor M1 and a drain of a current-source NMOS transistor M5. During normal operation, the source of source-follower transistor M1 will be equal its gate voltage minus its threshold voltage Vt. The source of source-follower transistor M1 thus equals VDD–2Vt during normal operation.

A diode-connected NMOS transistor M2 has its drain and gate coupled to internal power rail 105. To provide ESD protection, the gate of transistor M2 may couple to internal power rail 105 through a resistor R1. Another resistor R couples between the source of transistor M2 and a drain of an NMOS current-source transistor M4. Both current-source transistors M4 and M5 are in a current mirror configuration with a diode-connected NMOS transistor M3. The gate/drain of transistor M3 thus couples to the gates of transistors M4 and M5. The source of transistor M3 couples to ground whereas its drain/gate couple through a resistor R2 to internal power supply rail 105.

During the normal mode of operation, transistor M3 will conduct a current I substantially equaling the ratio of the power supply voltage VDD to the resistance for resistor R2. Current-source transistors M4 and M5 will thus bias their respective loads (transistors M2 and M1, respectively) with the same current I due to the current-mirror configuration with transistor M3. The drain of transistor M4 will then equal (VDD–Vt)–I*R whereas the drain of transistor M5 will equal (VDD–2Vt)–I*R. The drain voltage for current-source transistor M4 is received at a positive input for comparator 125. Similarly, the drain voltage for current-source transistor M5 is received at a negative input for comparator 125. During normal operation, the drain voltage for transistor M4 is thus higher than the drain voltage of transistor M5 by the threshold voltage Vt. The output signal from comparator 125 will then be high so that inverter 135 grounds the gate of RCP switch transistor 115 to switch it on as is necessary in the normal mode so that power supply rail 105 is coupled to buffer supply node 110. But note that mismatches, noise, and other vagaries could affect this relationship between the input voltages to comparator 125. To guarantee that RCP switch transistor 115 remains on during the normal mode of operation, resistor R coupled to the source of source-follower transistor M1 may be in series with an additional resistor $R_{offset}$. It will be appreciated that in alternative embodiments, resistors R and $R_{offset}$ may be replaced by a single resistor having a sufficiently greater resistance than the resistance for the remaining resistor R coupled to the source of diode-connected transistor M2. The drain voltage for transistor M5 will thus equal VDD–2Vt–

I*(R+R$_{offset}$) to guarantee that RCP switch transistor 115 remains on during the normal mode of operation. In addition, comparator 125 may be configured to have a relatively low threshold voltage to further ensure that RCP switch transistor 115 is switched on during the normal mode of operation.

When the power supply voltage VDD is collapsed after the normal mode of operation transitions to a deep sleep mode, there will be a period of time in which the power supply voltage VDD discharges towards ground but can still power comparator 125 (for illustration clarity, the power coupling of comparator 125 to power supply rail 105 is not shown in FIG. 1). During the discharge period, the charge stored on capacitor C in reference voltage circuit 130 will eventually drive the drain voltage of transistor M5 higher than the drain voltage for transistor M4. Comparator 125 will thus drive its output low so that inverter 135 drives the gate voltage for RCP switch transistor 115 high to shut it off in response to the reference voltage Vref becoming greater than the voltage for power supply rail 105. As the rail voltage becomes completely discharged, there is no more power to drive comparator 125 but that doesn't matter since its output signal will remain discharged. The resulting reverse current switch protection is quite advantageous as it requires no additional terminals or externally-generated control signals. Moreover, a single RCP circuit 100 may protect multiple I/O buffers.

In one embodiment, inverter 135 may be deemed to comprise a means for opening an RCP switch in response to a power supply voltage discharging below a reference voltage, the means being coupled to a buffer power supply node to receive power. An example system of integrated circuits will now be discussed.

Figure 2:
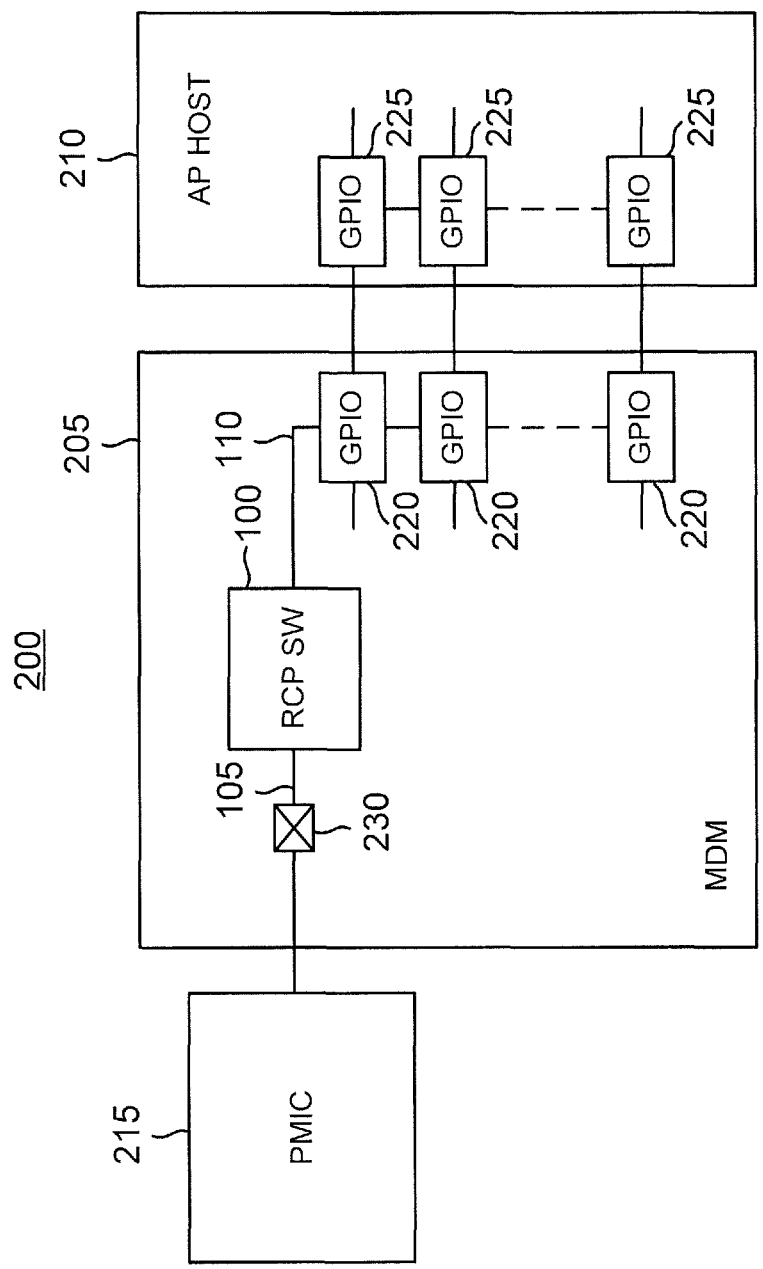
FIG. 2 is a circuit diagram of a system including the reverse current protection circuit of FIG. 1.

A system 200 is shown in FIG. 2 that includes a protected integrated circuit 205 incorporating RCP circuit 100. In system 200, protected integrated circuit 205 comprises a modem processor (MDM) that interfaces with an external applications processor (AP) host integrated circuit 210. It will be appreciated, however, that RCP circuit 100 may be applied to any collection of integrated circuits requiring reverse current protection. The protected I/O buffers in MDM 205 are General Purpose I/O (GPIO) buffers 220 that interface with corresponding GPIO buffers 225 in AP host 210. Advantageously, AP host 210 needs no software modifications with regard to the operation of RCP circuit 100. Thus, one or more of GPIO buffers 225 may drive their output signals high while a power supply voltage VDD is collapsed in MDM 205. RCP circuit 100 functions to isolate power supply rail 105 from the resulting high voltage on buffer supply node 110. Power supply rail 105 may be powered through a power terminal 230 driven by a power management integrated circuit (PMIC) 215. A method of operation for a reverse current switch will now be discussed.

Figure 3:
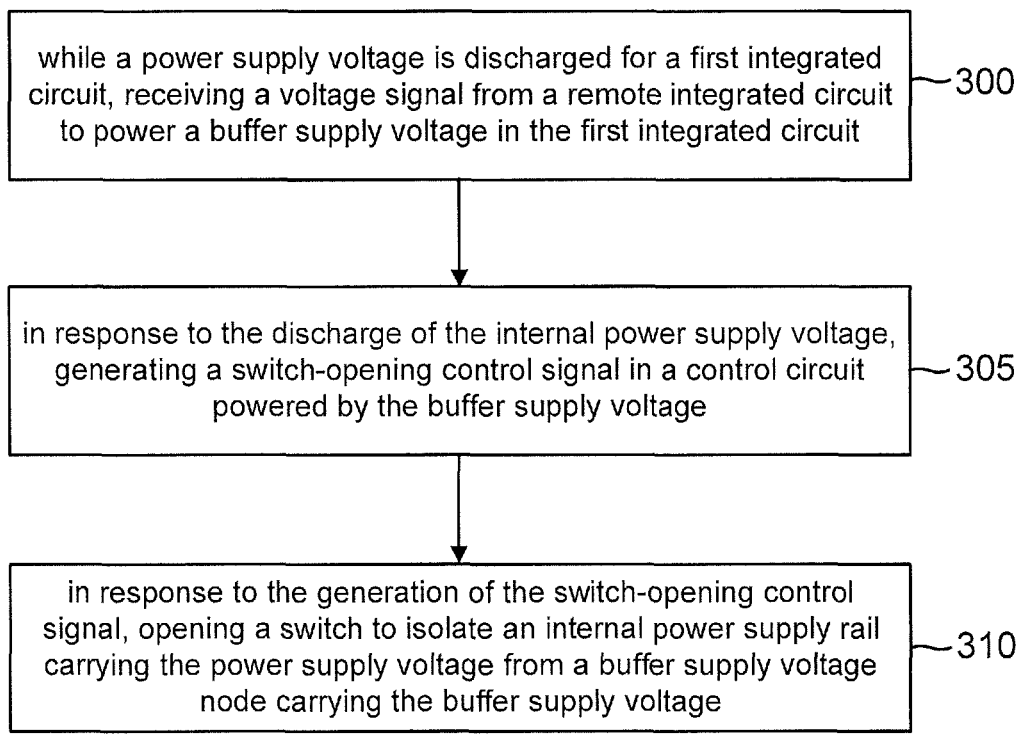
FIG. 3 is a flowchart for a method of operation for a reverse current protection circuit in accordance with an embodiment of the disclosure.

FIG. 3 is a flowchart for an example method of operation for a reverse current protection circuit in accordance with an embodiment of the disclosure. The method includes an act 300 that is performed while a power supply voltage is discharged for a first integrated circuit and comprises receiving a voltage signal from a remote integrated circuit to power a buffer supply voltage in the first integrated circuit. The receipt of an asserted voltage signal at buffer power supply node 110 while the power supply voltage VDD is discharged on power supply rail 105 in RCP circuit 100 of FIG. 1 is an example of act 300. The method also includes an act 305 that is performed in response to the discharging of the power supply voltage in act 300. Act 305 comprises generating a switch-opening control signal in a circuit powered by the buffer supply voltage. The charging of the output signal from inverter 135 to switch off RCP switch transistor 115 is an example of act 305. Finally, the method includes an act 310 that is performed in response to the generation of the switch-opening signal and comprises opening a switch to isolate a power supply rail carrying the power supply voltage from a buffer supply voltage node carrying the buffer supply voltage. The switching off of RCP current switch transistor 115 is an example of act 310.

As those of some skill in this art will by now appreciate and depending on the particular application at hand, many modifications, substitutions and variations can be made in and to the materials, apparatus, configurations and methods of use of the devices of the present disclosure without departing from the spirit and scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

We claim:

1. An integrated circuit, comprising:
   an I/O terminal for receiving a signal from a remote integrated circuit;
   an electrostatic discharge diode;
   an input/output (I/O) buffer including a buffer supply voltage node coupled through the electrostatic discharge diode to the I/O terminal;
   a reverse current protection (RCP) switch coupled between a power supply rail and the buffer power supply node;
   a voltage reference circuit configured to generate a reference voltage from a power supply voltage supplied by the power supply rail; and
   a control circuit powered by a buffer supply voltage carried on the buffer power supply node, wherein the control circuit is configured to open the RCP switch in response to a determination that the reference voltage is greater than the power supply voltage and to close the RCP switch in response to a determination that the reference voltage is less than the power supply voltage.

2. The integrated circuit of claim 1, further comprising a power terminal configured to receive the power supply voltage to power the power supply rail.

3. The integrated circuit of claim 1, wherein the RCP switch comprises a PMOS transistor.

4. The integrated circuit of claim 3, wherein the control circuit comprises an inverter having an output signal configured to drive the gate of the PMOS transistor.

5. The integrated circuit of claim 1, further comprising:
   a comparator configured to compare the reference voltage to the power supply voltage to make the determination that the reference voltage is greater than the power supply voltage and to make the determination that the reference voltage is less than the power supply voltage.

6. The integrated circuit of claim 5, wherein the comparator is configured to be powered by the power supply voltage.

7. The integrated circuit of claim 5, wherein the voltage reference circuit comprises a diode-connected transistor coupled between the power supply rail and a capacitor.

8. The integrated circuit of claim 7, further comprising:
   a source-follower transistor coupled to the power supply rail, wherein the capacitor couples between ground and a gate of source-follower transistor.

9. The integrated circuit of claim 8, further comprising:
a second diode-connected transistor having its drain coupled to the power supply rail;
a first resistor having a first terminal coupled to a source of the second diode-connected transistor; and
a second resistor having a first terminal coupled to a source of the source-follower transistor, wherein the comparator is configured to compare a voltage at a second terminal for the first resistor to a voltage at a second terminal of the second resistor to determine whether the reference voltage is greater than the power supply voltage.

10. The integrated circuit of claim 9, wherein a resistance for the first resistor is greater than a resistance for the second resistor.

11. The integrated circuit of claim 9, wherein the second terminal of the first resistor is coupled to a positive input for the comparator, and wherein the second terminal of the second resistor is coupled to a negative input for the comparator.

12. The integrated circuit of claim 9, further comprising:
a first current source configured to bias the second diode-connected transistor with a first current; and
a second current source configured to bias the source-follower transistor with the first current.

13. The integrated circuit of claim 12, wherein the first current source and the second current source each comprises a current source transistor, the integrated circuit further comprising a third diode-connected transistor in a current mirror configuration with the current source transistors.

14. A method, comprising:
while a power supply voltage carried on a power supply node is discharged for a first integrated circuit, receiving from a remote integrated circuit a voltage signal at an I/O terminal coupled through an electrostatic discharge diode to the power supply node to power a buffer supply voltage in the first integrated circuit;
in response to the discharge of the power supply voltage, generating a switch-opening control signal in a control circuit powered by the buffer supply voltage; and
in response to the generation of the switch-opening signal, opening a switch to isolate a power supply rail carrying the power supply voltage from a buffer supply voltage node carrying the buffer supply voltage.

15. The method of claim 14, further comprising closing the switch in response to the power supply rail being powered.

16. The method of claim 14, further comprising comparing a capacitively-stored reference voltage to the power supply voltage to determine whether the power supply voltage is discharged.

17. A system, comprising
a first integrated circuit including:
a power supply rail;
an input/output (I/O) buffer including a buffer supply voltage node coupled through an ESD diode to an I/O terminal;
a reverse current protection (RCP) switch coupled between the buffer supply voltage node and the power supply rail;
a reference voltage circuit configured to generate a capacitively-stored reference voltage from the power supply voltage; and
means for opening the RCP switch in response to the power supply voltage discharging below the reference voltage, the means being coupled to the buffer power supply node to receive power; and
a second integrated circuit including an I/O buffer having an I/O terminal coupled to the I/O terminal of the first integrated circuit.

18. The system of claim 17, further comprising:
a power management integrated circuit (PMIC), wherein the first integrated circuit includes a power terminal coupled to the power supply rail and configured to receive power from the PMIC.

19. The system of claim 17, wherein the first integrated circuit comprises a baseband integrated circuit and the second integrated circuit comprises an applications processor.

* * * * *